US012751335B2

(12) United States Patent
Chen

(10) Patent No.: US 12,751,335 B2
(45) Date of Patent: Sep. 29, 2026

(54) MEMORY DEVICE

(71) Applicant: MACRONIX INTERNATIONAL CO., LTD., Hsinchu (TW)

(72) Inventor: Shih-Hung Chen, HsinChu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 545 days.

(21) Appl. No.: 18/451,159

(22) Filed: Aug. 17, 2023

(65) Prior Publication Data

US 2025/0062277 A1 Feb. 20, 2025

(51) Int. Cl.

| | |
|---|---|
| ***H01L 23/00*** | (2006.01) |
| ***H10B 80/00*** | (2023.01) |
| ***H10W 20/20*** | (2026.01) |
| ***H10W 90/00*** | (2026.01) |

(52) U.S. Cl.

CPC ............ *H10W 90/00* (2026.01); *H10B 80/00* (2023.02); *H10W 20/20* (2026.01); *H10W 90/752* (2026.01); *H10W 90/753* (2026.01); *H10W 90/792* (2026.01)

(58) Field of Classification Search

CPC ....... H10W 90/00; H10W 20/20; H10B 80/00

See application file for complete search history.

(56) References Cited

U.S. PATENT DOCUMENTS

| | | | | |
|---|---|---|---|---|
| 8,987,787 | B2 | 3/2015 | Chen et al. | |
| 9,047,953 | B2 | 6/2015 | Chen | |
| 9,240,405 | B2 | 1/2016 | Chen et al. | |
| 11,176,989 | B2 | 11/2021 | Oh | |
| 11,289,130 | B2 | 3/2022 | Chen | |
| 12,027,463 | B2 | 7/2024 | Xiao | |
| 12,219,774 | B2 * | 2/2025 | Lee | G11C 16/08 |
| 2012/0161092 | A1 * | 6/2012 | Mieno | H10B 63/10 438/34 |
| 2019/0004358 | A1 * | 1/2019 | Yang | G02F 1/13452 |
| 2020/0381411 | A1 * | 12/2020 | Van Den Hoek | H10H 20/811 |
| 2023/0005541 | A1 * | 1/2023 | Yang | G11C 16/0483 |
| 2023/0005544 | A1 * | 1/2023 | Chen | G11C 16/0483 |
| 2023/0005858 | A1 * | 1/2023 | Chen | H10B 43/27 |

(Continued)

FOREIGN PATENT DOCUMENTS

| | | | |
|---|---|---|---|
| TW | 202226546 | A | 7/2022 |
| WO | 2023272634 | A1 | 1/2023 |
| WO | 2023272638 | A1 | 1/2023 |

OTHER PUBLICATIONS

James, et al.: "Unlocking the Secrets of the YMTC 64-Layer 3D Xtacking® NAND Flash"; Unlocking the Secrets of the YMTC 64-Layer 3D Xtacking® NAND Flash—Semiconductor Digest; Sep. 8, 2020; pp. 1-9.

*Primary Examiner* — Thao P Le

(74) *Attorney, Agent, or Firm* — McClure, Qualey & Rodack, LLP

(57) ABSTRACT

A memory device includes a peripheral substrate and an array substrate. The peripheral substrate includes a page buffer and a high voltage processing circuits and has a peripheral substrate area. The array substrate includes an array. The array substrate and the peripheral substrate are stacked on each other, and a circuit distribution area of the high voltage processing circuit accounts for less than 10% of the peripheral substrate area.

17 Claims, 8 Drawing Sheets

(56) References Cited

U.S. PATENT DOCUMENTS

| | | | | |
|---|---|---|---|---|
| 2023/0154537 | A1* | 5/2023 | Song | G11C 16/0483<br>365/230.06 |
| 2023/0240076 | A1* | 7/2023 | Kim | H10B 43/40 |
| 2023/0317654 | A1* | 10/2023 | Kim | H10W 72/90 |
| 2024/0030169 | A1* | 1/2024 | Kim | H10W 72/019 |
| 2024/0038708 | A1* | 2/2024 | Park | H10W 72/012 |
| 2024/0179917 | A1* | 5/2024 | Park | H10B 41/41 |
| 2024/0194260 | A1* | 6/2024 | Chen | G11C 16/0483 |
| 2024/0196631 | A1* | 6/2024 | Chen | H10B 43/40 |

* cited by examiner

MEMORY DEVICE

TECHNICAL FIELD

The disclosure relates in general to a memory device.

BACKGROUND

With the shrinking of the chip size and the faster and faster development of the operating speed, the chip is more likely to generate a large amount of heat during operation. Therefore, how to dissipate the heat generated during the operation of the chip is one issue of the industry in this technical field.

SUMMARY

According to one embodiment, a memory device is provided. The memory device includes a peripheral substrate and an array substrate. The peripheral substrate includes a page buffer and a first high voltage processing circuit and has a peripheral substrate area. The array substrate includes an array. The array substrate and the peripheral substrate are stacked on each other, and a first circuit distribution area of the first high voltage processing circuit accounts for less than 10% of the peripheral substrate area.

According to another embodiment, a memory device is provided. The memory device includes a peripheral substrate, an array substrate and a high voltage processing substrate. The peripheral substrate includes a page buffer. The array substrate includes an array. The high voltage processing substrate includes a high voltage processing circuit. The array substrate, the peripheral substrate and the high voltage processing substrate are stacked on each other, and the peripheral substrate does not have any high voltage processing circuit.

According to another embodiment, a memory device is provided. The memory device includes a circuit board, a peripheral substrate, an array substrate and a high voltage processing substrate. The peripheral substrate includes a page buffer. The high voltage processing substrate includes a high voltage processing circuit and has a high voltage processing substrate area. The array substrate includes an array. The array substrate and the peripheral substrate are stacked on the circuit board, and the high voltage processing substrate is disposed on the circuit board, and a high voltage processing circuit area of the high voltage processing circuit accounts for greater than 90% of the high voltage processing substrate area.

Figure 1A:
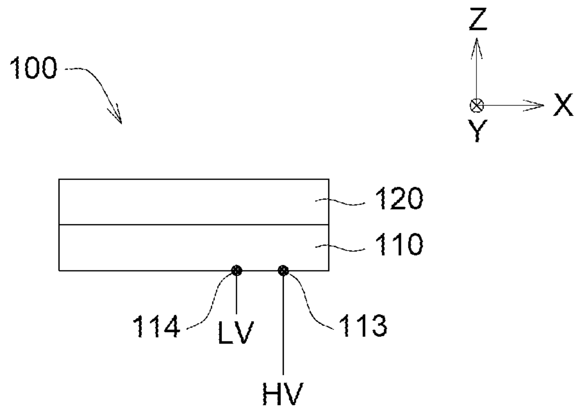
FIG. 1A illustrates a schematic diagram of a side view of a memory device according to an embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1B:
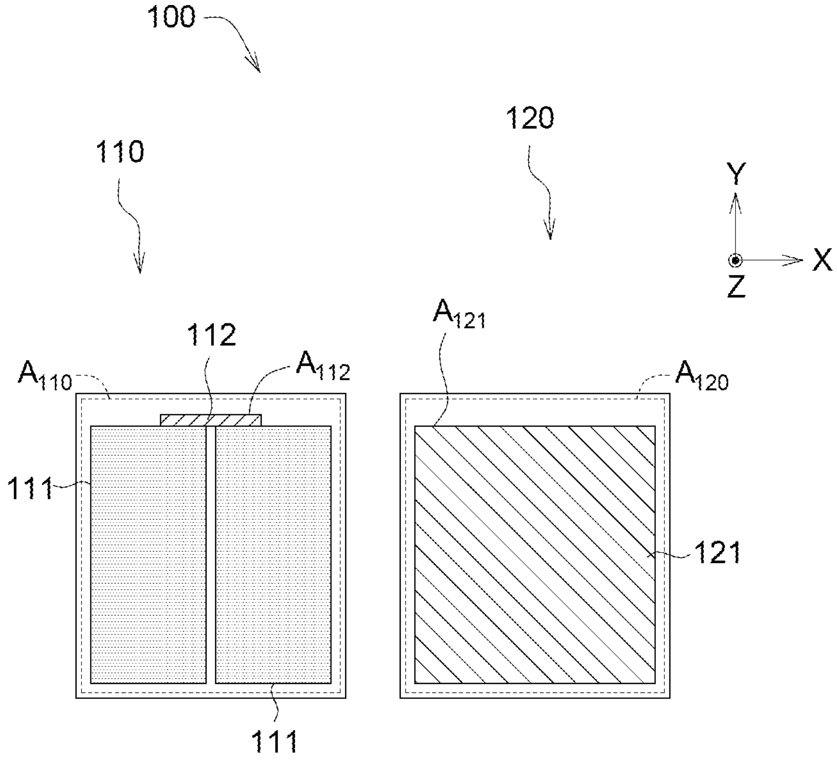
FIG. 1B illustrates a schematic diagram of a top view of a peripheral substrate and an array substrate in FIG. 1A.

Referring to FIGS. 1A to 1B, FIG. 1A illustrates a schematic diagram of a side view of a memory device 100 according to an embodiment of the present invention, and FIG. 1B illustrates a schematic diagram of a top view of a peripheral substrate 110 and an array substrate 120 in FIG. 1A. The memory device 100 is, for example, a flash memory, such as a NAND memory.

As shown in FIG. 1B, the memory device 100 includes the peripheral substrate 110 and the array substrate 120. The peripheral substrate 110 includes at least one page buffer 111 and a first high voltage processing circuit 112 and has a peripheral substrate area $A_{110}$. The array substrate 120 includes an array 121. The array substrate 120 and the peripheral substrate 110 are stacked on each other, and a first circuit distribution area $A_{112}$ of the first high voltage processing circuit 112 accounts for less than 10% of the peripheral substrate area $A_{110}$, such as 1%, 2%, 3%, 4%, 5%, 6%, 7%, 8%, 9%, 10% or a real number between the aforementioned two proportional values. In comparison with the page buffer 111, the first high voltage processing circuit 112 and the array 121 formed on the same substrate, since the array 121 is formed on the array substrate 120 in the present embodiment, the peripheral substrate 110 could spare a more space for the page buffer 111 with a larger area. The page buffer 111 with a larger area could provide more storage space for data reading, and meet the requirement of higher operating speed. In addition, the peripheral substrate 110 and the array substrate 120 could be manufactured separately, and it could simplify the overall manufacturing process and/or circuit design complexity of the memory device 100.

The so-called "array" herein includes, for example, "memory structure". The so-called "area" herein is, for example, "top view area".

A base of the peripheral substrate 110 and a base of the array substrate 120 are, for example, silicon wafers. The circuits on the peripheral substrate 110 and the array substrate 120 are, for example, formed by semiconductor manufacturing process.

As shown in FIG. 1A, the peripheral substrate 110 further includes at least one low voltage input contact 113 and at least one high voltage input contact 114. The low voltage input contact 113 is configured to receive one set or more of low voltage LV between 1.8 volts (V) to 5 V, and the high voltage input contact 114 is configured to receive a high voltage HV equal to or higher than 5 V. Due to the memory device 100 directly receiving the high voltage HV to reduce a boosting load of the first high voltage processing circuit 112 (for example, simplifying circuit design, reducing occupied space, etc.), a ratio of the first circuit distribution area $A_{112}$ of the first high voltage processing circuit 112 to the peripheral substrate area $A_{110}$ could be relatively reduced (In comparison with the fact that the peripheral substrate 110 does not receive the high voltage HV).

The "contact" herein refers to various input/output contacts, for example, a conductive pad, a conductive bump, a conductive pillar, etc.

The "high voltage processing circuit" herein is, for example, configured to raise the low voltage to the high voltage, for example, to an operating voltage of the array, such as 30 V. Specifically, the high voltage processing circuit is, for example, a charge pumping circuit, a word line decoder, a word line switch, or other circuits capable of converting or processing high voltage and the low voltage.

As shown in FIG. 1B, the peripheral substrate 110 includes circuits other than the array. In other words, the peripheral substrate 110 does not include the array, and circuits other than the array could be formed on the peripheral substrate 110. The peripheral substrate 110 and the array substrate 120 could be connected through face to face cu—cu hybrid bonding and through-silicon via (TSV) (similar to the conductive via 510*v* and the conductive via 530*v* in FIG. 5A) for signal vertical connection. In other embodiment, the peripheral substrate 110 and the array substrate 120 could be connected through hybrid bonding for signal vertical connection, wherein the hybrid bonding is, for example, that: the metal pads for connection could be formed on the peripheral substrate 110 and the array substrate 120 respectively, and the peripheral substrate 110 and the array substrate 120 could be connected through the metal pads for electrical connection and signally connection.

As shown in FIG. 1B, the array substrate 120 has an array substrate area $A_{120}$. In the present embodiment, the array substrate 120 does not include a second high voltage processing circuit. In another embodiment, the array substrate 120 may include the second high voltage processing circuit having a second circuit distribution area, wherein the second circuit distribution area of the second high voltage processing circuit accounts for less than 1% of the array substrate area $A_{120}$. Since the memory device 100 could directly receive the high voltage HV, the proportion of the second high voltage processing circuit in the array substrate 120 could be reduced, or even completely omitted.

Figure 2A:
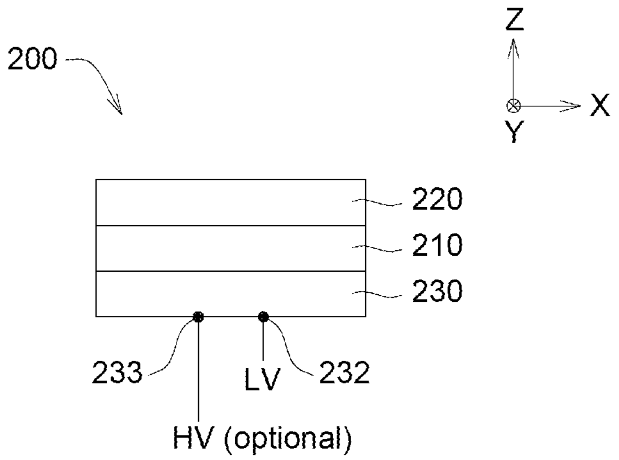
FIG. 2A illustrates a schematic diagram of a side view of a memory device according to another embodiment of the present invention.
Figure 2B:
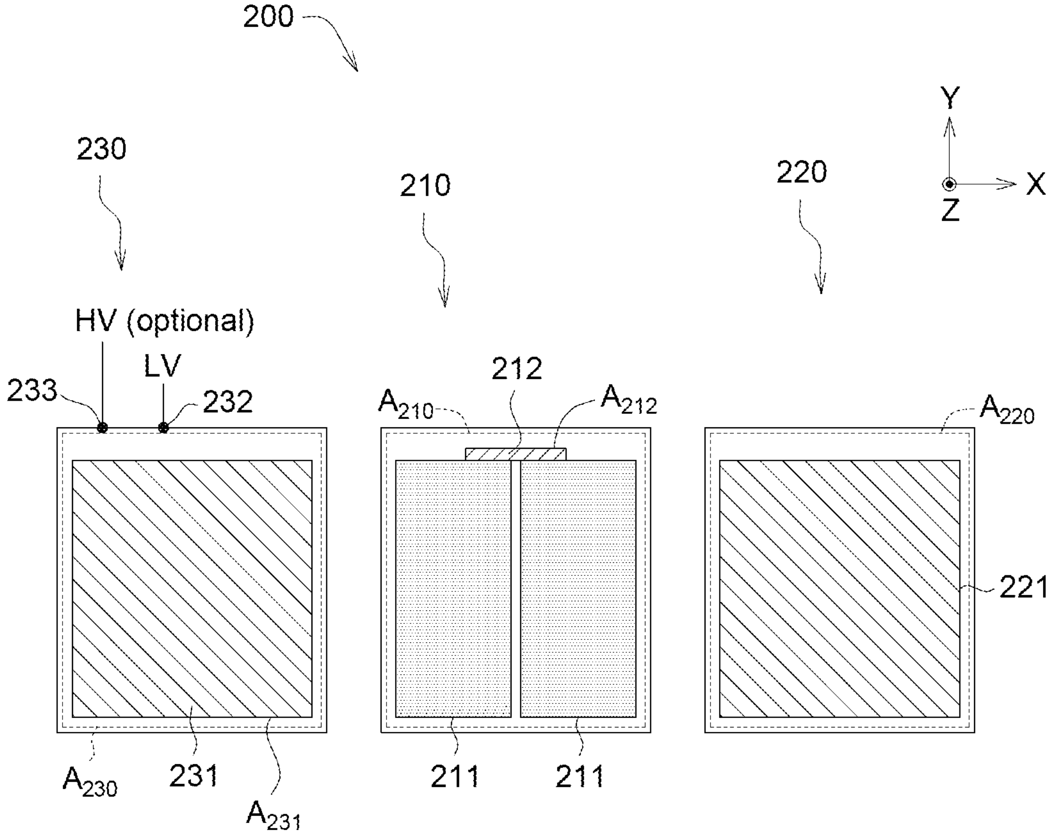
FIG. 2B illustrates a schematic diagram of a top view of a peripheral substrate, an array substrate and a high voltage processing substrate of the memory device in FIG. 2A.

Referring to FIGS. 2A to 2B, FIG. 2A illustrates a schematic diagram of a side view of a memory device 200 according to another embodiment of the present invention, and FIG. 2B illustrates a schematic diagram of a top view of a peripheral substrate 210, an array substrate 220 and a high voltage processing substrate 230 of the memory device 200 in FIG. 2A. The memory device 200 is, for example, a flash memory, such as a NAND memory.

As shown in FIG. 2A, the memory device 200 includes the peripheral substrate 210, the array substrate 220 and the high voltage processing substrate 230. The array substrate 220, the peripheral substrate 210 and the high voltage processing substrate 230 are stacked on each other. One of the array substrate 220, the peripheral substrate 210 and the high voltage processing substrate 230 could be disposed between the other two of the array substrate 220, the peripheral substrate 210 and the high voltage processing substrate 230. A base of the peripheral substrate 210, the base of the array substrate 220 and the base of the high voltage processing substrate 230 are, for example, silicon wafers. The circuits on the peripheral substrate 210, the array substrate 220 and the high voltage processing substrate 230 are formed by semiconductor process.

As shown in FIG. 2B, the peripheral substrate 210 includes a page buffer 211 and has a peripheral substrate area $A_{210}$. The array substrate 220 includes an array 221. A first circuit distribution area $A_{212}$ of the first high voltage processing circuit 212 accounts for less than 10% of the peripheral substrate area $A_{210}$, such as 1%, 2%, 3%, 4%, 5%, 6%, 7%, 8%, 9% %, 10%, or a real number between the aforementioned two proportional values. In comparison with the page buffer 211, the first high voltage processing circuit 212 and the peripheral substrate 210 are formed on the same substrate, since the array 221 is formed on the array substrate 220 in the present embodiment, the peripheral substrate 210 could spare a more space for the page buffer 211 with a larger area. The page buffer 211 with a larger area could provide more storage space for data reading, and meet the requirement of higher operating speed. In addition, the peripheral substrate 210, the array substrate 220 and the high voltage processing substrate 230 are manufactured separately, and could simplify the overall manufacturing process and/or circuit design complexity of the memory device 200.

As shown in FIG. 2B, the peripheral substrate 210 includes circuits other than the array. In other words, the peripheral substrate 210 does not include the array, and circuits other than the array could be formed on the peripheral substrate 210. Two of the peripheral substrate 210, the array substrate 220 and high voltage processing substrate 230 could be connected through at least one TSV (similar to the conductive via 510*v* and the conductive via 530*v* in FIG. 5A) for signal vertical connection. In other embodiment, two of the peripheral substrate 210, the array substrate 220 and high voltage processing substrate 230 could be connected through hybrid bonding for signal vertical connection, wherein the hybrid bonding is, for example, that: the metal pads for connection could be formed on two substrates respectively, and the two substrates could be connected through the metal pads for electrical connection and signally connection.

As shown in FIG. 2B, the array substrate 220 has an array substrate area $A_{220}$. In the present embodiment, the array substrate 220 does not include the second high voltage processing circuit. In another embodiment, the array substrate 220 may include the second high voltage processing circuit having a second circuit distribution area, wherein the second circuit distribution area of the second high voltage processing circuit accounts for less than 1% of the array substrate area $A_{220}$. Since the memory device 200 could receive the high voltage HV, the proportion of the second high voltage processing circuit in the array substrate 220 could be reduced, or even completely omitted.

As shown in FIG. 2B, the high voltage processing substrate 230 includes a third high voltage processing circuit 231, at least one low voltage input contact 232 and at least one high voltage input contact 233. The low voltage input contact 232 is configured to receive the low voltage LV less than 5 V, and the high voltage input contact 233 is configured to receive the high voltage HV equal to or higher than 5 V. The memory device 200 could selectively receive the high voltage HV. In the present embodiment, a third circuit distribution area $A_{231}$ of the third high voltage processing circuit 231 accounts for more than 90% of the high voltage processing substrate area $A_{230}$ of the high voltage processing substrate 230, for example, 90%, 91%, 92%, 93%. %, 94%, 95%, 96%, 97%, 98%, 98%, 100%, or a real number between the aforementioned two proportional values. In the present embodiment, even if the high voltage input contact 233 is omitted, due to the third circuit distribution area $A_{231}$ of the third high voltage processing circuit 231 accounting for more than 90% of the high voltage processing substrate area $A_{230}$ of the high voltage processing substrate 230, there is enough space to form a boost circuit capable of boosting the low voltage LV to the high voltage HV in the high voltage processing substrate 230.

In the present embodiment, due to most of the high voltage processing circuits of the memory device 200 being disposed on the high voltage processing substrate 230, the overall thermal management of the memory device 200 could be performed on the high voltage processing substrate 230 alone, and it is conduce to the heat dissipation rate of the memory device 200.

Figure 3A:
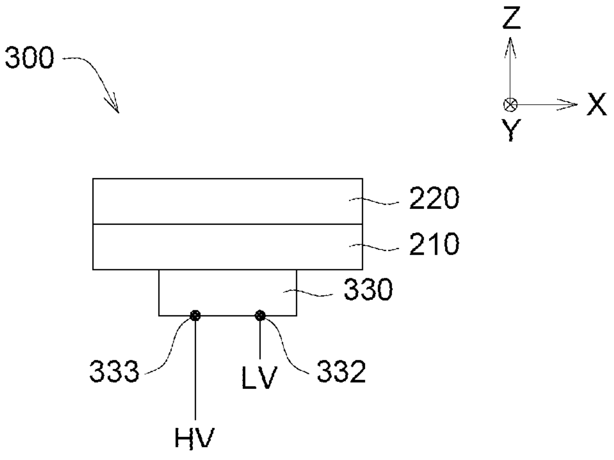
FIG. 3A illustrates a schematic diagram of a side view of a memory device according to another embodiment of the present invention.
Figure 3B:
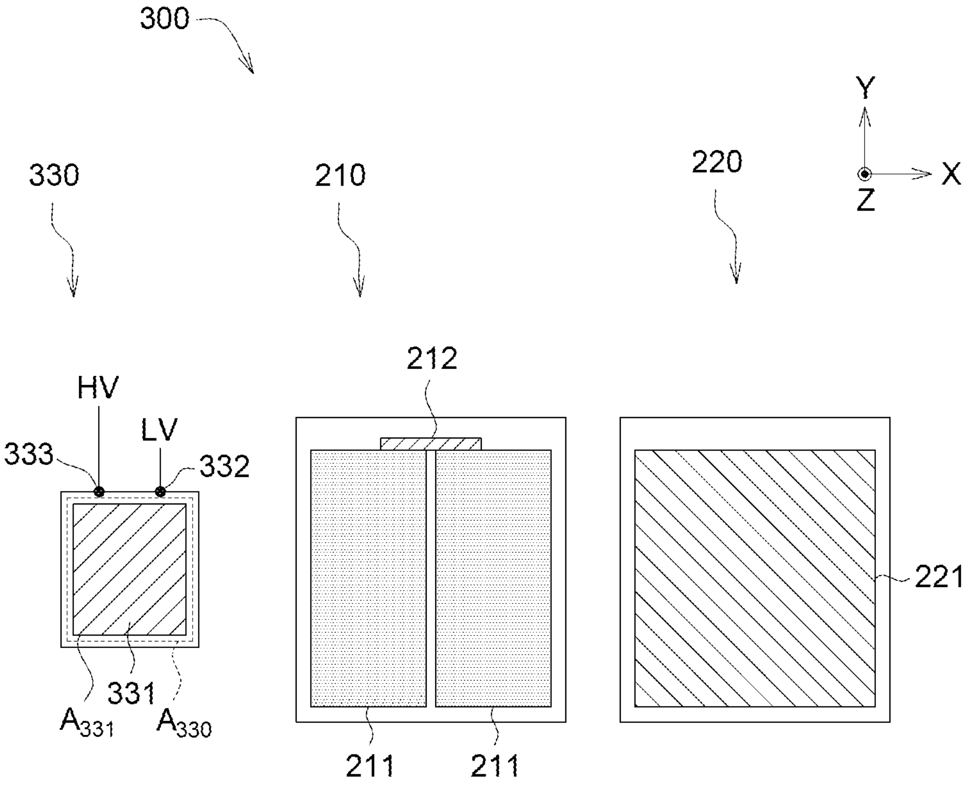
FIG. 3B illustrates a schematic diagram of a top view of the peripheral substrate, the array substrate and a high voltage processing substrate of the memory device in FIG. 3.

Referring to FIGS. 3A to 3B, FIG. 3A illustrates a schematic diagram of a side view of a memory device 300 according to another embodiment of the present invention, and FIG. 3B illustrates a schematic diagram of a top view of the peripheral substrate 210, the array substrate 220 and a high voltage processing substrate 330 of the memory device 300 in FIG. 3A. The memory device 300 is, for example, a flash memory, such as a NAND memory.

As shown in FIG. 3B, the memory device 300 includes the peripheral substrate 210, the array substrate 220 and the high voltage processing substrate 330. The array substrate 220, the peripheral substrate 210 and the high voltage processing substrate 330 are stacked on each other. One of the array substrate 220, the peripheral substrate 210 and the high voltage processing substrate 330 could be disposed between the other two of the array substrate 220, the peripheral substrate 210 and the high voltage processing substrate 330. The base of the peripheral substrate 210, the base of the array substrate 220 and the base of the high voltage processing substrate 330 are, for example, silicon wafers. The circuits on the peripheral substrate 210, the array substrate 220 and the high voltage processing substrate 330 are formed by semiconductor process.

The memory device 300 of the embodiment of the present invention includes the features (structure, connection relationship, etc.) the same as or similar to that of the memory device 200, and difference is that a size (for example, a top-view area) of the high voltage processing substrate 330 of the memory device 300 is smaller.

Figure 5A:
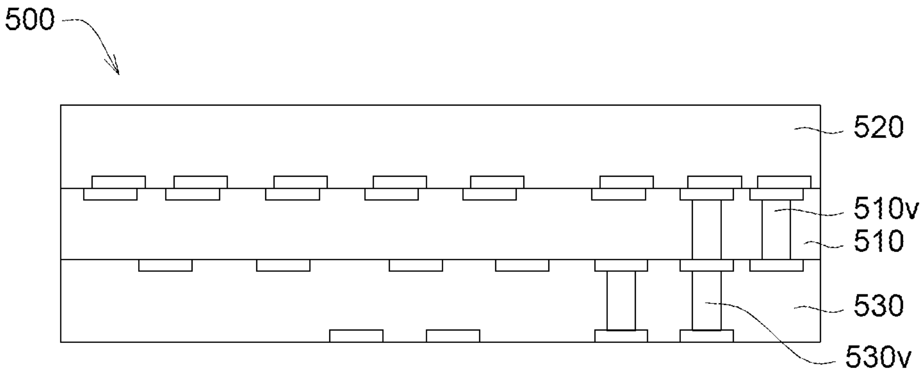
FIG. 5A illustrates a schematic diagram of a cross-sectional view of a memory device according to another embodiment of the present invention.

Two of the peripheral substrate 210, the array substrate 220 and high voltage processing substrate 330 could be connected through at least one TSV (similar to the conductive via 510*v* and the conductive via 530*v* in FIG. 5A) for signal vertical connection. In other embodiment, two of the peripheral substrate 210, the array substrate 220 and high voltage processing substrate 330 could be connected through hybrid bonding for signal vertical connection, wherein the hybrid bonding is, for example, that: the metal pads for connection could be formed on two substrates respectively, and the two substrates could be connected through the metal pads for electrical connection and signally connection.

As shown in FIG. 3B, the high voltage processing substrate 330 includes a third high voltage processing circuit 331, at least one low voltage input contact 332 and at least one high voltage input contact 333. The low voltage input contact 332 is configured to receive the low voltage LV less than 5 V, and the high voltage input contact 333 is configured to receive the high voltage HV equal to or higher than 5 V. In the present embodiment, a third circuit distribution area $A_{331}$ of the third high voltage processing circuit 331 accounts for more than 90% of a high voltage processing substrate area $A_{320}$ of the high voltage processing substrate 330, for example, 90%, 91%, 92%, 93%. %, 94%, 95%, 96%, 97%, 98%, 98%, 100%, or a real number between the aforementioned two proportional values. In the present embodiment, due to the memory device 300 directly receiving the high voltage HV to reduce a boosting load of the first high voltage processing circuit 331 (for example, simplifying circuit design, reducing occupied space, etc.), a size of the high voltage processing substrate 330 could be reduced.

Figure 4A:
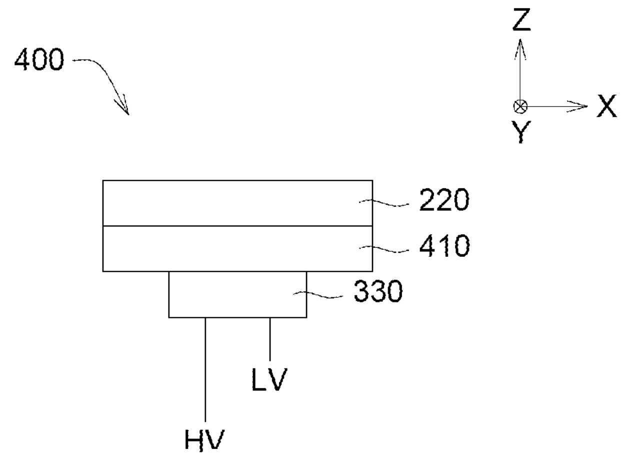
FIG. 4A illustrates a schematic diagram of a side view of a memory device according to another embodiment of the present invention.
Figure 4B:
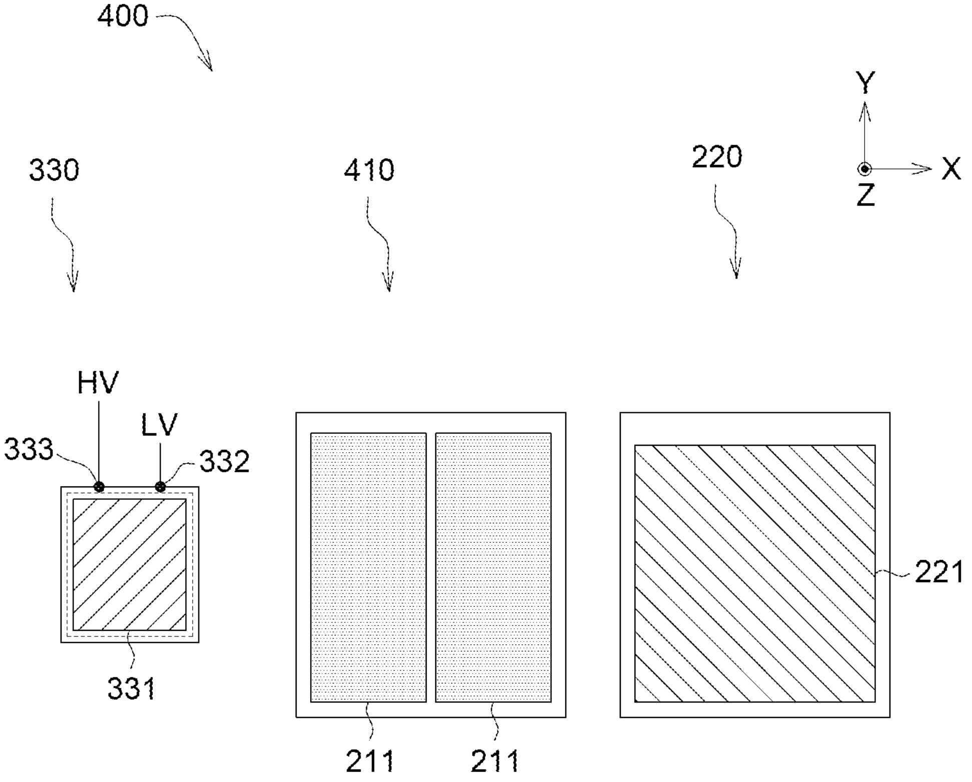
FIG. 4B illustrates a schematic diagram of a top view of a peripheral substrate, the array substrate and the high voltage processing substrate of the memory device in FIG. 4A.

Referring to FIGS. 4A to 4B, FIG. 4A illustrates a schematic diagram of a side view of a memory device 400 according to another embodiment of the present invention, and FIG. 4B illustrates a schematic diagram of a top view of a peripheral substrate 410, the array substrate 220 and the high voltage processing substrate 330 of the memory device 400 in FIG. 4A. The memory device 400 is, for example, a flash memory, such as a NAND memory.

As shown in FIG. 4A, the memory device 400 includes the peripheral substrate 410, the array substrate 220 and the high voltage processing substrate 330. The peripheral substrate 410, the array substrate 220 and the high voltage processing substrate 330 are stacked on each other. One of the peripheral substrate 410, the array substrate 220 and the high voltage processing substrate 330 could be disposed between the other two of the peripheral substrate 410, the array substrate 220 and the high voltage processing substrate 330. The base of the peripheral substrate 410, the base material of the array substrate 220 and the base of the high voltage processing substrate 330 are, for example, silicon wafers. The circuits on the peripheral substrate 410, the array substrate 220 and the high voltage processing substrate 330 are formed by, for example, semiconductor manufacturing processes.

The memory device 400 of the embodiment of the present invention includes features (for example, structure, connection relationship, etc.) the same as or similar to that of the memory device 300, and difference is that the peripheral substrate 410 could omit the first high voltage processing circuit 212.

As shown in FIG. 4B, the high voltage processing substrate 330 includes the third high voltage processing circuit 331, at least one low voltage input contact 332 and at least one high voltage input contact 333. The low voltage input contact 332 is configured to receive the low voltage LV less than 5 V, and the high voltage input contact 333 is configured to receive the high voltage HV equal to or higher than 5 V. In the present embodiment, the third circuit distribution area $A_{331}$ of the third high voltage processing circuit 331 accounts for more than 90% of the high voltage processing substrate area $A_{320}$ of the high voltage processing substrate 330, for example, 90%, 91%, 92%, 93%. %, 94%, 95%, 96%, 97%, 98%, 98%, 100%, or a real number between the aforementioned two proportional values. In the present embodiment, due to the memory device 400 directly receiving the high voltage HV to reduce a boosting load of the first high voltage processing circuit 331 (for example, simplifying circuit design, reducing occupied space, etc.), the size of the high voltage processing substrate 330 could be reduced.

Two of the peripheral substrate 410, the array substrate 220 and high voltage processing substrate 330 could be connected through at least one TSV (similar to the conductive via 510*v* and the conductive via 530*v* in FIG. 5A) for signal vertical connection. In other embodiment, two of the peripheral substrate 410, the array substrate 220 and high voltage processing substrate 330 could be connected through hybrid bonding for signal vertical connection, wherein the hybrid bonding is, for example, that: the metal pads for connection could be formed on two substrates respectively, and the two substrates could be connected through the metal pads for electrical connection and signally connection.

Referring to FIG. 5A, FIG. 5A illustrates a schematic diagram of a cross-sectional view of a memory device 500 according to another embodiment of the present invention. The memory device 500 is, for example, a flash memory, such as a NAND memory. The memory device 500 includes a peripheral substrate 510, an array substrate 520 and a high voltage processing substrate 530. The peripheral substrate 510, the array substrate 520 and the high voltage processing substrate 530 are stacked on each other. One of the peripheral substrate 510, the array substrate 520 and the high voltage processing substrate 530 could be disposed between the other two of the peripheral substrate 510, the array substrate 520 and the high voltage processing substrate 530.

As shown in FIG. 5A, in the present embodiment, the peripheral substrate 510 includes the features the same as or similar to that of the peripheral substrates in other embodiments, and it will not be repeated here. The array substrate 520 includes the features the same as or similar to that of the array substrate in other embodiment, and it will not be repeated here. The high voltage processing substrate 530 includes the features the same as or similar to that of the high voltage processing substrates in other embodiments, and it will not be repeated here.

As shown in FIG. 5A, in the present embodiment, one of the peripheral substrate 510, the array substrate 520, and the high voltage processing substrate 530 includes at least one conductive via, and the conductive via is electrically connected to another of the peripheral substrate 510, the array substrate 520 and the high voltage processing substrate 530. For example, as shown in FIG. 5A, the peripheral substrate 510 has at least one conductive via 510*v*, the high voltage processing substrate 530 has at least one conductive via 530*v*, and the conductive via 510*v* electrically connects the array substrate 520 with the conductive via 530*v* of the high voltage processing substrate 530. The conductive via herein are, for example, TSV.

Figure 5B:
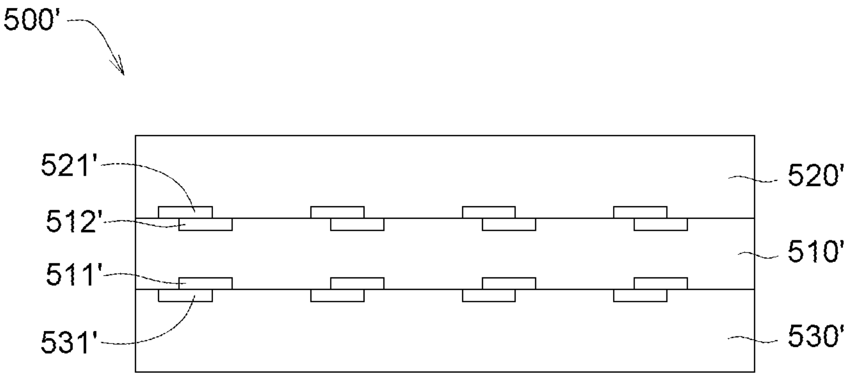
FIG. 5B illustrates a schematic diagram of a cross-sectional view of a memory device according to another embodiment of the present invention.

Referring to FIG. 5B, FIG. 5B illustrates a schematic diagram of a cross-sectional view of a memory device 500' according to another embodiment of the present invention. The memory device 500' is, for example, a flash memory, such as a NAND memory. The memory device 500 includes a peripheral substrate 510', an array substrate 520' and a high voltage processing substrate 530'. The peripheral substrate 510', the array substrate 520' and the high voltage processing substrate 530' are stacked on each other. One of the peripheral substrate 510', the array substrate 520' and the high voltage processing substrate 530' could be disposed between the other two of the peripheral substrate 510', the array substrate 520' and the high voltage processing substrate 530'.

Different from the memory device 500 in FIG. 5A, two substrates of the memory device 500' in the present embodiment could be connected by hybrid bonding. For example, the peripheral substrate 510' includes at least one pad 511' and at least one pad 512', wherein the pad 511' and the pad 512' are respectively formed on opposite two sides of the array substrate 510'. The array substrate 520' includes at least one pad 521'. The high voltage processing substrate 530' includes at least one pad 531'. The pads 512' of the peripheral substrate 510' and the pads 521' of the array substrate 520' are connected by hybrid bonding, and the pads 511' of the peripheral substrate 510' and the pads 531' of the high-voltage processing substrate 530' are connected by hybrid bonding. In addition, the pad is, for example, metal pad.

Figure 6A:
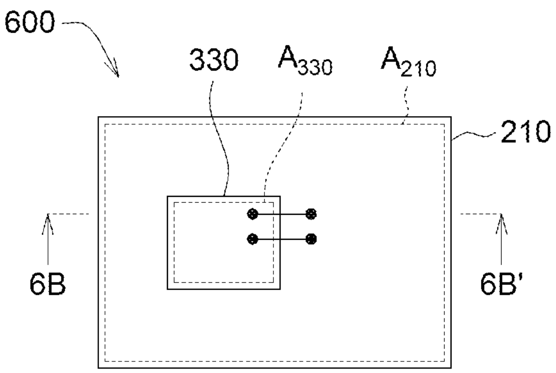
FIG. 6A illustrates a schematic diagram of a top view of a memory device according to another embodiment of the present invention.
Figure 6B:
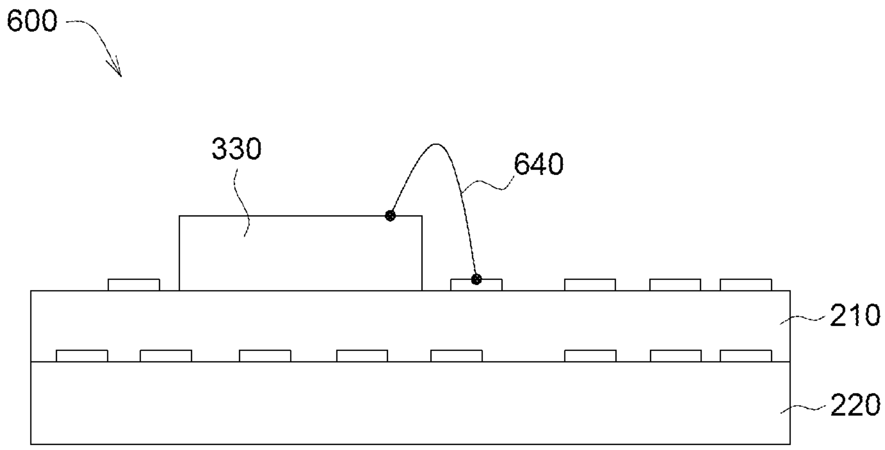
FIG. 6B illustrates a schematic diagram of a cross-sectional view of the memory device in FIG. 6A in a direction 6A-6B'.

Referring to FIGS. 6A to 6B, FIG. 6A illustrates a schematic diagram of a top view of a memory device 600 according to another embodiment of the present invention, and FIG. 6B illustrates a schematic diagram of a cross-sectional view of the memory device 600 in FIG. 6A in a direction 6A-6B'. The memory device 600 is, for example, a flash memory, such as a NAND memory.

As shown in FIGS. 6A and 6B, the memory device 600 includes the peripheral substrate 210, the array substrate 220, the high voltage processing substrate 330 and at least one solder wire 640. In the present embodiment, the peripheral substrate 210 is disposed between the array substrate 220 and the high voltage processing substrate 330, but this is not intended to limit the embodiment of the present invention. A high voltage processing substrate area $A_{330}$ of the high voltage processing substrate 330 is smaller than the peripheral substrate area $A_{210}$ of the peripheral substrate 210, and the solder wire 640 connects the high voltage processing substrate 330 with the peripheral substrate 210.

Figure 7A:
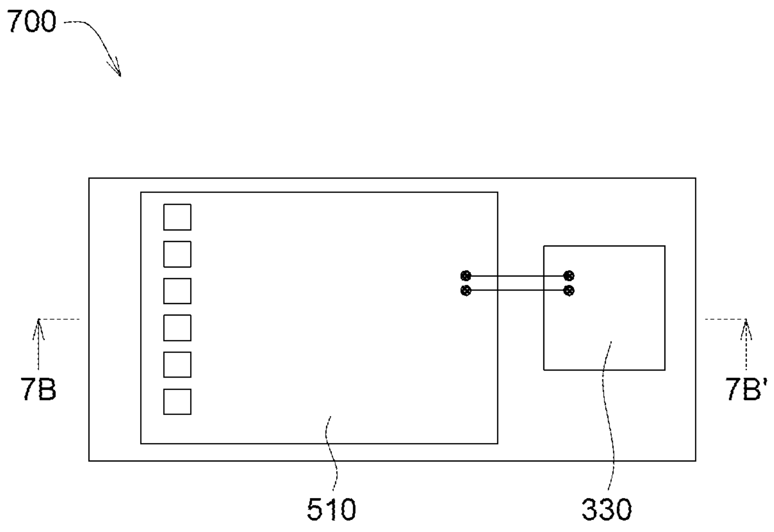
FIG. 7A illustrates a schematic diagram a top view of a memory device according to another embodiment of the present invention.
Figure 7B:
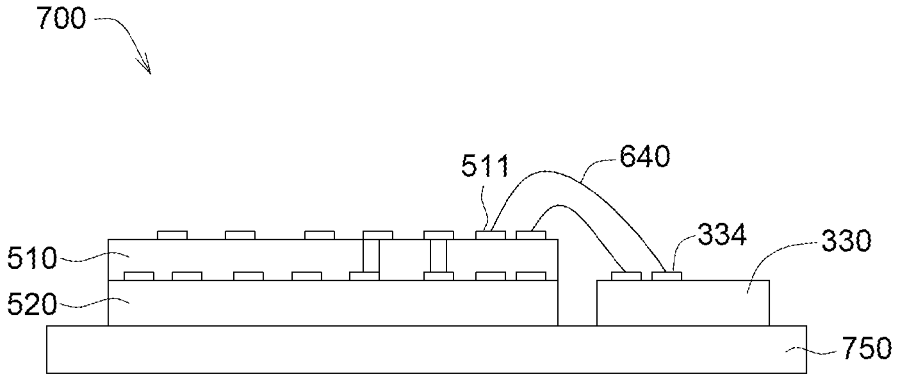
FIG. 7B illustrates a schematic diagram of a cross-sectional view of the memory device of FIG. 7A in a direction 7A-7B'.

Referring to FIGS. 7A to 7B, FIG. 7A illustrates a schematic diagram a top view of a memory device 700 according to another embodiment of the present invention, and FIG. 7B illustrates a schematic diagram of a cross-sectional view of the memory device 700 of FIG. 7A in a direction 7A-7B'. The memory device 700 is, for example, a flash memory, such as a NAND memory.

As shown in FIGS. 7A and 7B, the memory device 700 includes the peripheral substrate 510, the array substrate 520, the high voltage processing substrate 330, at least one solder wire 640 and a circuit board 750. In the present embodiment, the peripheral substrate 510 and the array substrate 520 are stacked on the circuit board 750, and the high voltage processing substrate 330 is disposed on the circuit board 750, wherein a stack structure composed of the peripheral substrate 510 and the array substrate 520 is disposed on the circuit board 750 with the high voltage processing substrate 330 side by side. The peripheral substrate 510 includes at least one contact 511 exposed from the peripheral substrate 510 and facing upward. The high voltage processing substrate 330 includes at least one contact 334 exposed from the high voltage processing substrate 330 and facing upward. The solder wire 640 connects the exposed contact 331 of the high voltage processing substrate 330 with the exposed contact 511 of the peripheral substrate 510.

Figure 8A:
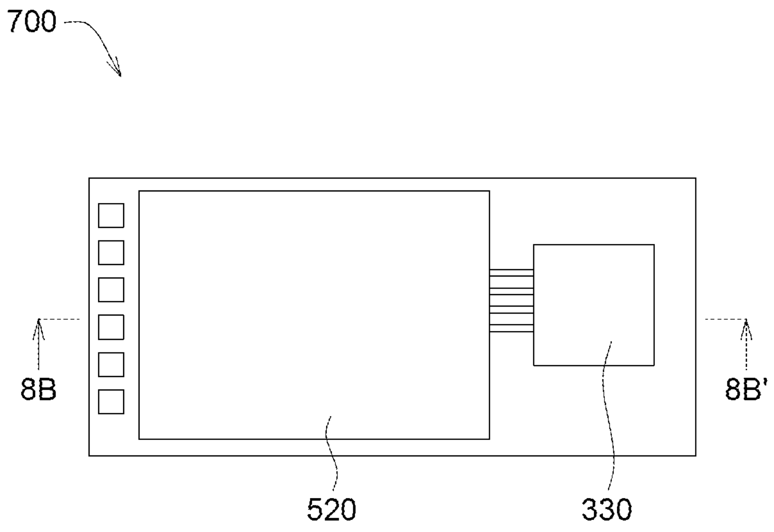
FIG. 8A illustrates a schematic diagram of a top view of a memory device according to another embodiment of the present invention.
Figure 8B:
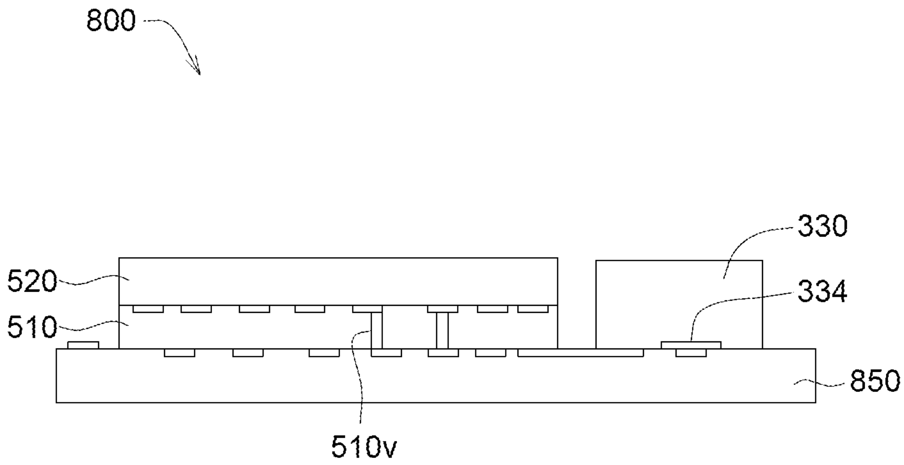
FIG. 8B illustrates a schematic diagram of a cross-sectional view of the memory device of FIG. 8A in a direction 8A-8B'.

Referring to FIGS. 8A to 8B, FIG. 8A illustrates a schematic diagram of a top view of a memory device 800 according to another embodiment of the present invention, and FIG. 8B illustrates a schematic diagram of a cross-sectional view of the memory device 800 of FIG. 8A in a direction 8A-8B'. The memory device 800 is, for example, a flash memory, such as a NAND memory.

As shown in FIGS. 8A and 8B, the memory device 800 includes the peripheral substrate 510, the array substrate 520, the high voltage processing substrate 330 and a circuit board 850. In the present embodiment, the peripheral substrate 510 and the array substrate 520 are stacked on the circuit board 850, and the high voltage processing substrate 330 is disposed on the circuit board 850, wherein a stack structure composed of the peripheral substrate 510 and the array substrate 520 is disposed on the circuit board 850 with the high voltage processing substrate 330 side by side. The peripheral substrate 510 includes at least one conductive via 510*v* which is electrically connected to the circuit board 850 facing downward. The high voltage processing substrate 330 includes at least one contact 331 which is electrically connected to the circuit board 850 facing downward. As a result, the aforementioned stacked structure and the high voltage processing substrate 330 are electrically connected through the circuit board 850.

To sum up, the embodiment of the present invention proposes a memory device including a page buffer, a high voltage processing circuit and an array, wherein the page buffer, most of the high voltage processing circuit and the array could be respectively formed on different substrates. In comparison with the page buffer, the high voltage processing circuit and the array formed on the same one substrate, since the array in the present embodiment is formed to the array substrate, the peripheral substrate could spare a more space for the page buffer with a larger area. The page buffer with a larger area could provide more storage space for data reading, and meet the requirement of higher operating speed. In addition, the peripheral substrate and the array substrate could be manufactured separately, and it could simplify the overall manufacturing process and/or circuit design complexity of the memory device. In another embodiment, at least two of the peripheral substrate, the array substrate and the high voltage processing substrate are stacked on each other to form a stack structure and are disposed on the circuit board, while an another one of the peripheral substrate, the array substrate and the high voltage processing substrate is disposed on the circuit board with the stack structure side by side. In addition, the aforementioned stacked structure could be electrically connected to the another one through a solder wire. Alternatively, the aforementioned stacked structure could be electrically connected to the another one through a circuit board (the solder wire could be omitted).

It will be apparent to those skilled in the art that various modifications and variations could be made to the disclosed embodiments. It is intended that the specification and examples be considered as exemplary only, with a true scope of the disclosure being indicated by the following claims and their equivalents.

What is claimed is:

1. A memory device, comprising:

a peripheral substrate comprising a page buffer and a first high voltage processing circuit and having a peripheral substrate area; and an array substrate comprising an array;

wherein the array substrate and the peripheral substrate are stacked on each other, and a first circuit distribution area of the first high voltage processing circuit accounts for less than 10% of the peripheral substrate area;

wherein the memory device further comprises:

a circuit board;

a high voltage processing substrate;

wherein the peripheral substrate and the high voltage processing substrate are disposed on the circuit board side by side.

2. The memory device as claimed in claim 1, wherein the array substrate has an array substrate area, and comprises a second high voltage processing circuit, a second circuit distribution area of the second high voltage processing circuit accounts for less than 1% of the array substrate area.

3. The memory device as claimed in claim 1, wherein the array substrate, the peripheral substrate and the high voltage processing substrate are stacked on each other.

4. The memory device as claimed in claim 3, wherein the high voltage processing substrate comprises a low voltage input contact, and the low voltage input contact is configured to receive a voltage less than 5 Volts (V).

5. The memory device as claimed in claim 3, wherein the high voltage processing substrate comprises a high voltage input contact, and the high voltage input contact is configured to receive a voltage equal to or higher than 5 V.

6. The memory device as claimed in claim 1, wherein the peripheral substrate further comprises a low voltage input contact, and the low voltage input contact is configured to receive a voltage less than 5 V.

7. The memory device as claimed in claim 1, wherein the peripheral substrate further comprises a high voltage input contact, and the high voltage input contact is configured to receive a voltage equal to or higher than 5 V.

8. The memory device as claimed in claim 1, wherein one of the peripheral substrate and the array substrate comprises at least one conductive via, and the conductive via is electrically connected to the other of the peripheral substrate and the array substrate.

9. The memory device as claimed in claim 3, wherein a high voltage processing substrate area of the high voltage processing substrate is smaller than the peripheral substrate area of the peripheral substrate; the memory device further comprises:

a solder wire connecting the high voltage processing substrate with the peripheral substrate.

10. The memory device as claimed in claim 1, further comprising:

a solder wire connecting the high voltage processing substrate with the peripheral substrate.

11. The memory device as claimed in claim 1, wherein the high voltage processing substrate is disposed on the circuit board with a contact.

12. A memory device, comprising:

a peripheral substrate comprising a page buffer;

an array substrate comprising an array; and a high voltage processing substrate comprising a high voltage processing circuit;

wherein the array substrate, the peripheral substrate and the high voltage processing substrate are stacked on each other, and the peripheral substrate does not have any high voltage processing circuit.

13. The memory device as claimed in claim 12, wherein the high voltage processing substrate comprises a low voltage input contact, and the low voltage input contact is configured to receive a voltage less than 5 V.

14. The memory device as claimed in claim 12, wherein the high voltage processing substrate comprises a high voltage input contact, and the high voltage input contact is configured to receive a voltage equal to or higher than 5 V.

15. A memory device, comprising:

a circuit board;

a peripheral substrate comprising a page buffer;

a high voltage processing substrate comprising a high voltage processing circuit and having a high voltage processing substrate area; and an array substrate comprising an array;

wherein the array substrate and the peripheral substrate are stacked on the circuit board, and the high voltage processing substrate is disposed on the circuit board, and a high voltage processing circuit area of the high voltage processing circuit accounts for greater than 90% of the high voltage processing substrate area;

wherein the peripheral substrate and the high voltage processing substrate are disposed on the circuit board side by side.

16. The memory device as claimed in claim 15, further comprising:

a solder wire connecting the high voltage processing substrate with the peripheral substrate.

17. The memory device as claimed in claim 15, wherein the high voltage processing substrate is disposed on the circuit board with a contact.

* * * * *